(12) United States Patent
Morita

(10) Patent No.: US 6,967,165 B2
(45) Date of Patent: Nov. 22, 2005

(54) METHOD FOR FABRICATING MULTILAYER INTERCONNECT AND METHOD FOR CHECKING THE SAME

(75) Inventor: Michio Morita, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 99 days.

(21) Appl. No.: 10/628,451

(22) Filed: Jul. 29, 2003

(65) Prior Publication Data

US 2004/0115915 A1 Jun. 17, 2004

(30) Foreign Application Priority Data

Jul. 29, 2002 (JP) ........................................ 2002-219313

(51) Int. Cl.[7] ............................................ H01L 21/302
(52) U.S. Cl. ........................ 438/689; 438/696; 438/695
(58) Field of Search ................................ 438/689, 696, 438/695, 723, 691, 672, 675, 709, 710, 711, 725–729, 692

(56) References Cited

U.S. PATENT DOCUMENTS

| | | | | |
|---|---|---|---|---|
| 5,338,399 A | * | 8/1994 | Yanagida | 216/67 |
| 5,366,590 A | * | 11/1994 | Kadomura | 438/723 |
| 5,401,359 A | * | 3/1995 | Kadomura | 438/16 |
| 5,417,826 A | * | 5/1995 | Blalock | 204/176 |
| 5,445,712 A | * | 8/1995 | Yanagida | 438/695 |
| 5,994,227 A | * | 11/1999 | Matsuo et al. | 438/696 |
| 6,069,092 A | * | 5/2000 | Imai et al. | 438/723 |
| 6,221,772 B1 | * | 4/2001 | Yang et al. | 438/689 |
| 6,326,307 B1 | * | 12/2001 | Lindley et al. | 438/689 |
| 6,461,977 B1 | * | 10/2002 | Matsuo et al. | 438/740 |

FOREIGN PATENT DOCUMENTS

JP P2000-188329 A 7/2000

* cited by examiner

*Primary Examiner*—Laura M Schillinger
(74) *Attorney, Agent, or Firm*—McDermott Will & Emery LLP (57) ABSTRACT

A method for forming a multilayer interconnect includes: a first step of forming a lower layer interconnect in an upper portion of a first insulating film and then forming a second insulating film and a third insulating film in this order on the first insulating film including the lower layer interconnect; a second step of forming an aperture in part of the third insulating film located above the lower layer interconnect; a third step of forming an interconnect groove in an upper portion of the third insulating film so that an upper portion of the aperture is part of the interconnect groove while reducing the thickness of part of the second insulating film located under the aperture without having the lower layer interconnect exposed; a fourth step of removing part of the second insulating film located under the aperture to expose the lower layer interconnect; and a fifth step of filling a conductive film in the aperture and the interconnect groove and thereby forming an upper layer interconnect and a connection portion for electrically connecting the upper layer interconnect and the lower layer interconnect.

8 Claims, 8 Drawing Sheets

METHOD FOR FABRICATING MULTILAYER INTERCONNECT AND METHOD FOR CHECKING THE SAME

BACKGROUND OF THE INVENTION

The present invention relates to methods for forming a multilayer interconnect in which a lower layer interconnect and an upper layer interconnect are connected through a via contact and methods for checking the same, and more particularly relates to a method for forming using a dual damascene process a multilayer interconnect in which a via contact and an upper layer interconnect are formed of a conductive material by filling the material into layers.

Conventionally, as a high-density interconnect used for a semiconductor integrated circuit or the like, multilayer interconnects in which a lower layer interconnect and an upper layer interconnect are connected through a via contact have been used. A dual damascene process in which a multilayer interconnect is simultaneously formed by filling a material into layers to form a via contact and an upper layer interconnect above a lower layer interconnect is one of known techniques for forming such a multilayer interconnect.

Hereinafter, a method for forming a multilayer interconnect using a known dual damascene process will be described with reference to the accompanying drawings.

FIGS. 5A through 5C, FIGS. 6A and 6B, and FIGS. 7A and 7B are cross-sectional views illustrating respective process steps for forming a known multilayer interconnect.

Figure 5A:
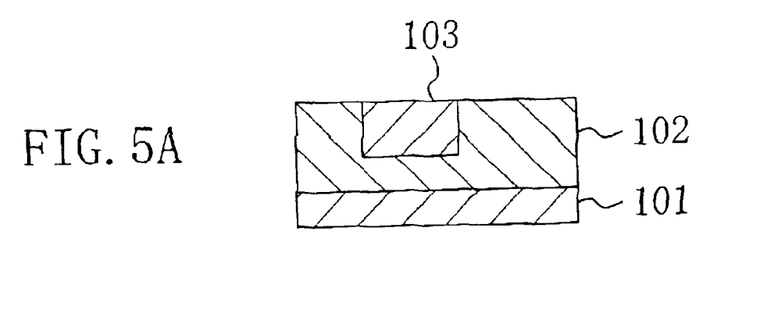
FIGS. 5A through 5C are cross-sectional views illustrating respective process steps for forming a multilayer interconnect according to a first known example.

First, as shown in FIG. 5A, on a semiconductor substrate 101 including integrated circuit elements, a first interlevel insulating film 102 is formed, an opening to be a lower layer interconnect forming region is formed by photolithography and dry etching, and then copper is deposited in a lower layer interconnect forming region by sputtering or metal plating. Thereafter, the substrate is polished by chemical mechanical polishing (CMP) until the first interlevel insulating film 102 is exposed. In this manner, a lower layer interconnect 103 of copper is formed in an upper part of the first interlevel film 102.

Figure 5B:
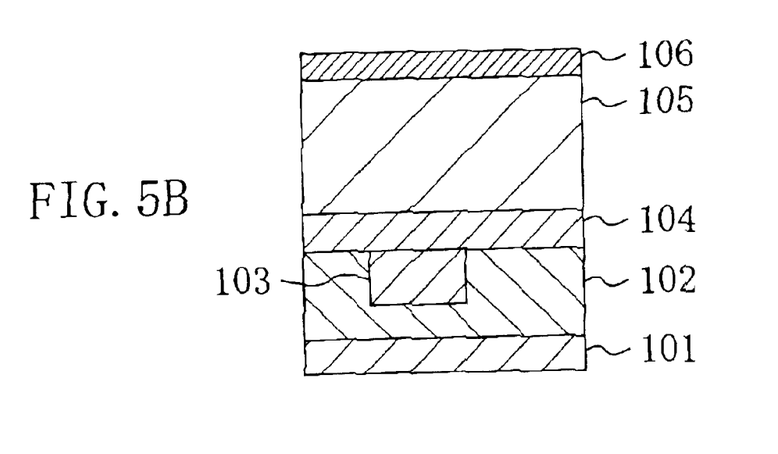

Next, as shown in FIG. 5B, an etching stopper layer 104 of silicon nitride and a second interlevel insulating film 105 of silicon oxide are deposited on the substrate in this order by plasma chemical vapor deposition (plasma CVD).

Subsequently, a first reflection-prevention film 106 of an organic material is formed on the second interlevel insulating film 105 by spin coating.

Figure 5C:
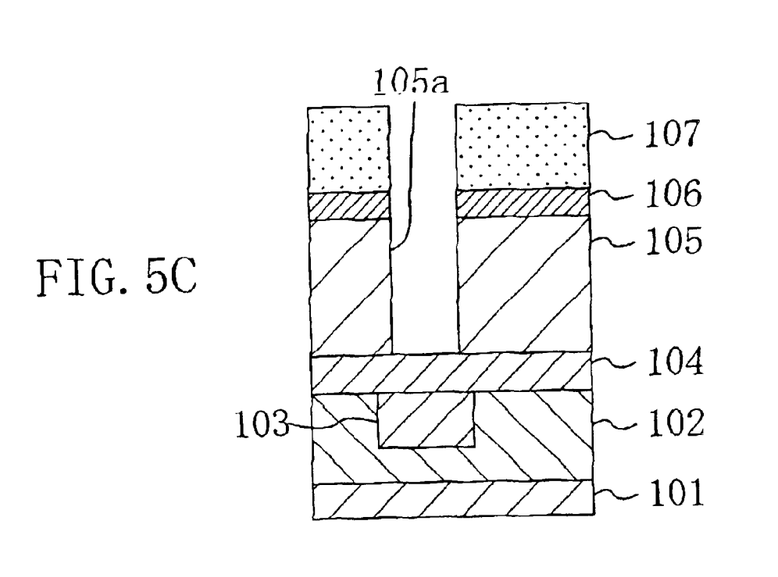

Next, as shown in FIG. 5C, a first resist pattern 107 is formed by photolithography, and then the first reflection-prevention film 106 and the second interlevel insulating film 105 are etched in this order by dry etching using the first resist pattern 107 as a mask. In this manner, an aperture 105a is formed in the second interlevel insulating film 105.

Figure 6A:
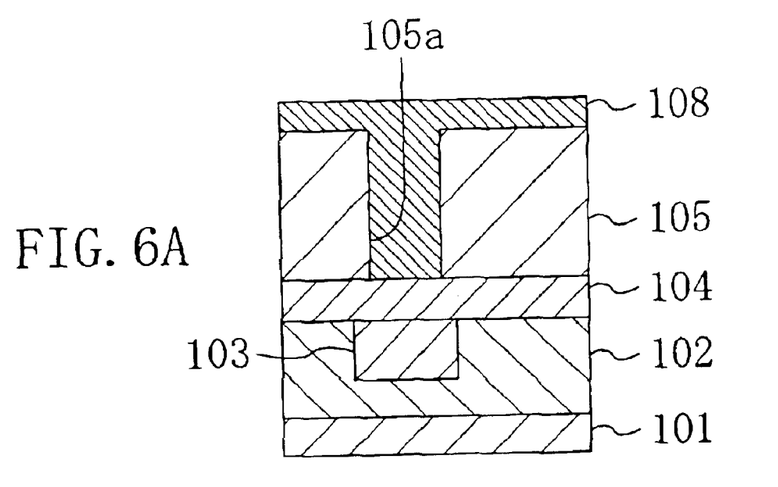
FIGS. 6A and 6B cross-sectional views illustrating respective process steps for forming a multilayer interconnect according to the first known example.

Next, as shown in FIG. 6A, the first resist pattern 107 and the first reflection-prevention film 106 are removed in this order by ashing, and then the surfaces of the second interlevel insulating film 105 are cleaned. Thereafter, the second reflection-prevention film 108 of an organic material is formed by spin coating so as to fill the aperture 105a.

Figure 6B:
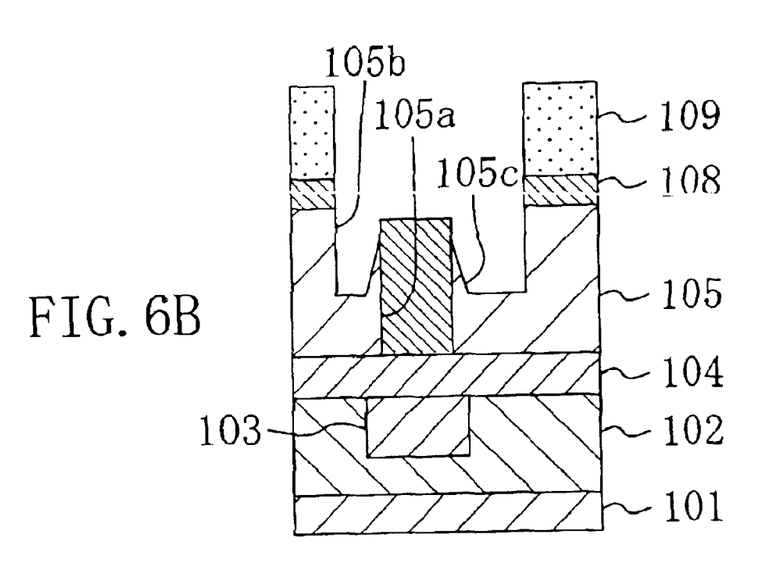

Next, as shown in FIG. 6B, a second resist pattern 109 is formed by photolithography, and then the second reflection-prevention film 108 and the second interlevel insulating film 105 are patterned in this order by dry etching using the second resist pattern 109 as a mask. In this manner, an interconnect groove 105b is formed.

In this dry etching, an etching rate for the second reflection-prevention film 108 filled in the aperture 105a is lower than that for the second interlevel insulating film 105. Therefore, the lower layer interconnect 103 and the etching stopper layer 104 which are located under the aperture 105a are protected by the second reflection-prevention film 108 filled in the aperture 105a from damages caused during the formation of the interconnect groove 105b.

In this case, when the interconnect groove 105b is formed, part of the second interlevel insulating film 105 which is in contact with the second reflection-prevention film 108 may not be removed and thus a etching residue having a projecting shape i.e., a crown fence 105c may be generated around the aperture 105a of the interconnect groove 105b.

Figure 7A:
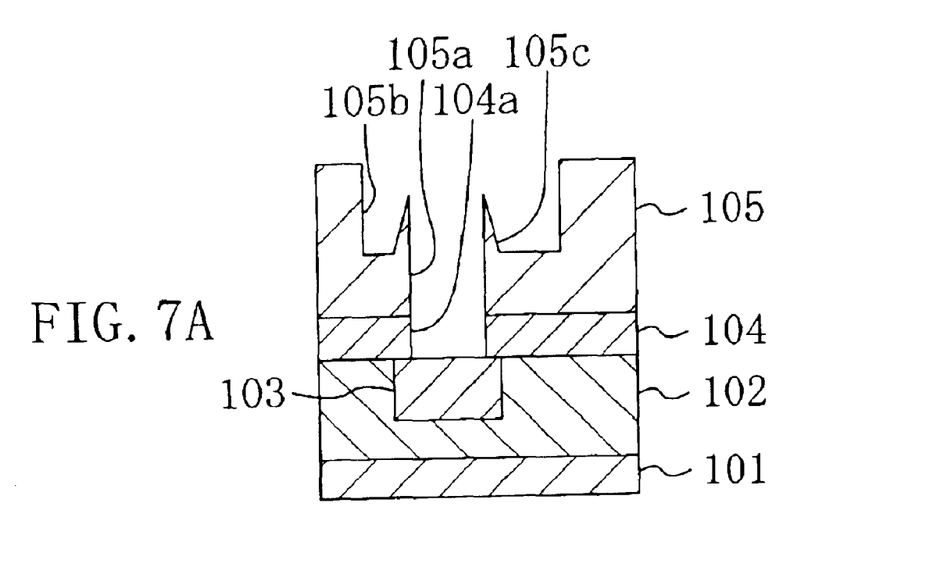
FIGS. 7A and 7B are cross-sectional views illustrating respective process steps for forming a multilayer interconnect according to the first known example.

Next, as shown in FIG. 7A, the second reflection-prevention film 108 and the second resist pattern 109 are removed by ashing, and then the surfaces of the second interlevel insulating film 105 are cleaned. Thereafter, part of the etching stopper layer 104 exposed at the bottom of the aperture 105a is removed by dry etching using the second interlevel insulating film 105 so that the lower layer interconnect 103 is exposed. In this manner, a via hole is formed so as to pass through the etching stopper layer 104 and the second interlevel insulating film 105 and reach the lower layer interconnect 103.

Figure 7B:
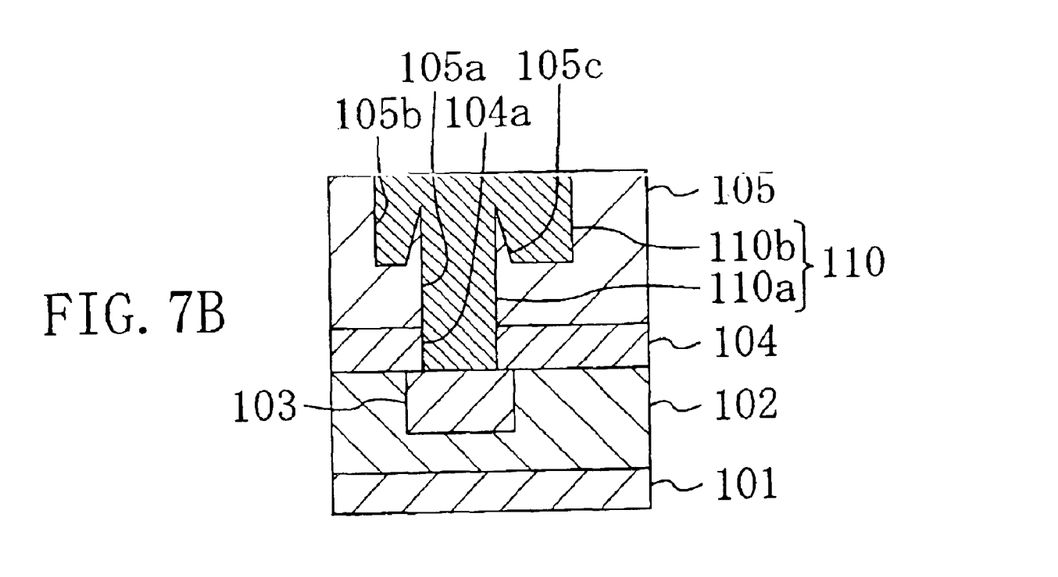

Next, as shown in FIG. 7B, a metal film 110 of copper is deposited on the second interlevel insulating film 105 by sputtering or metal plating so as to fill the aperture 105a and the interconnect groove 105b. Thereafter, copper is polished by CMP until the second interlevel insulating film 105 is exposed. In this manner, a multilayer interconnect in which part of the metal film 110 located in the aperture 105a to be a via contact 110a and part of the metal film 110 located in the interconnect groove 105b to be an upper layer interconnect 110b is formed.

Moreover, as an attempt to prevent the generation of the grown fence 105c in a first known example shown in FIG. 6B, a method for fabricating a semiconductor device in which an organic film is formed in a lower portion of an aperture 105a and then an interconnect groove is formed is well known.

Hereinafter, a method for forming a multilayer interconnect as a second known example in which an organic film is formed in a lower portion of the aperture 105a and then an interconnect groove is formed will be described with reference to the accompanying drawings.

Figure 8A:
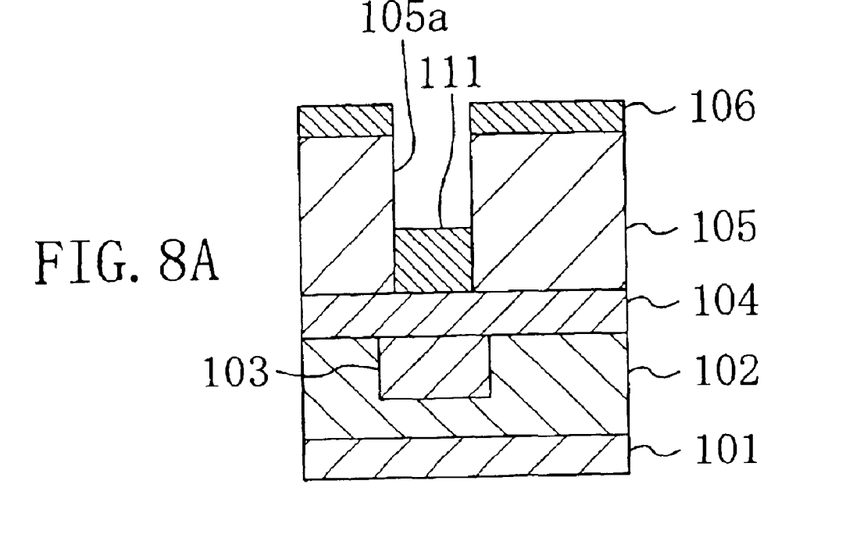
FIGS. 8A and 8B are cross-sectional views illustrating respective process steps for forming a multilayer interconnect according to a second known example.
Figure 8B:
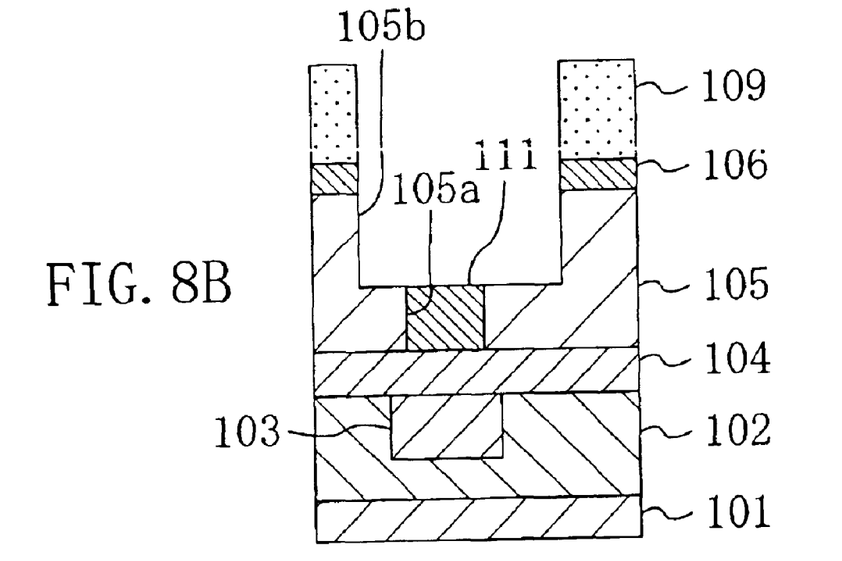

FIGS. 8A and 8B are cross-sectional views illustrating respective process steps for forming a multilayer interconnect in the second known example. Note that in FIG. 8, each member also shown in the first known example is identified by the same reference numeral and therefore description thereof will be omitted.

In the second known example, an aperture 105a is first formed in an second interlevel insulating film 105 in the same process steps of the first known example shown in FIGS. 5A through 5C.

Next, as shown in FIG. 8A, a first resist pattern 107 is removed and then the surfaces of the second interlevel insulating film 105 are cleaned. Thereafter, an organic material is applied over a first refection-prevention film 106 by spin coating so as to fill the aperture 105a. Then, the entire upper surface of the substrate is etched to form an organic film 111 of the organic material at the bottom of the aperture 105a. In this case, the organic film 111 protects a lower layer interconnect 103 from damages caused by etching in the process step forming an interconnect groove 105b to be performed next.

Next, as shown in FIG. 8B, an interconnect 105b is formed by dry etching using a second resist pattern 109 as a mask.

Thereafter, in the same process steps shown in FIGS. 7A and 7B, copper is deposited on the aperture 105a and the interconnect 105b, thereby forming a multilayer interconnect.

In the second known example, an organic material film is not filled in an upper portion of the aperture 105a which is to be an interconnect groove 105b forming region, and thus the interconnect groove 105b can be formed without any crown fence generated.

However, in the method for forming a multilayer interconnect according to the first known example, in the process step of forming an interconnect groove 105b, an organic material is filled in the aperture 105a in order to protect the lower layer interconnect 103 from damages caused by etching. Thus, a crown fence 105c is generated in part of the interconnect groove 105b which is in contact with the aperture 105a. Therefore, resist between an upper layer interconnect 110b and a via contact 110a is increased. Furthermore, the upper layer interconnect 110b and the via contact 110a may be electrically separated depending on the size of the crown fence 105c. As has been described, in the method for forming a multilayer interconnect of the first known example, the reliability of a multilayer interconnect as well as the yield thereof is reduced.

In contrast, when the interconnect groove 110b is formed without causing the generation of a crown fence using the method for forming a multilayer interconnect of the second known example, the number of process steps is increased, resulting in increased production costs.

Moreover, in the first and second known examples, in the process step of removing the part of an etching stopper layer 104 located under the aperture 105a to form a via hole, the part of the lower layer interconnect 103 exposed at the surface of the substrate is corroded by a plasma gas during etching. Therefore, the reliability of a multilayer interconnect is reduced.

SUMMARY OF THE INVENTION

The present invention has been devised to solve the above-described problems. It is therefore an object of the present invention to form an interconnect groove without generating a crown fence and to protect lower layer interconnect from damages caused during etching in the process steps of forming a via hole and the interconnect groove, thus improving the reliability and production yield of a multilayer interconnect.

To achieve the above-described object, a method for forming a multilayer interconnect according to the present invention includes: a first step of forming a lower layer interconnect in an upper portion of a first insulating film and then forming a second insulating film and a third insulating film in this order on the first insulating film including the lower layer interconnect; a second step of forming an aperture in part of the third insulating film located above the lower layer interconnect; a third step of forming an interconnect groove in an upper portion of the third insulating film so that an upper portion of the aperture is part of the interconnect groove, while reducing the thickness of part of the second insulating film located under the aperture without having the lower layer interconnect exposed; a fourth step of removing part of the second insulating film located under the aperture to expose the lower layer interconnect; and a fifth step of filling a conductive film in the aperture and the interconnect groove and thereby forming an upper layer interconnect and a connection portion for electrically connecting the upper layer interconnect and the lower layer interconnect.

In the method for forming a multilayer interconnect of the present invention, in the process steps of forming an aperture and an interconnect groove, a lower interconnect can be protected by a second insulating film. Therefore, an organic film for protecting the lower layer interconnect is not filled in an aperture in a third insulating film and thus no crown fence is generated in the interconnect groove. Moreover, in the process step of removing part of a second insulating film located under the aperture to expose the lower layer interconnect, the power of an etching apparatus is reduced to remove an etching stopper layer. Thus, damages on the lower layer interconnect can be reduced. Accordingly, it is possible to improve the reliability and production yield of a multilayer interconnect without increasing production costs.

In the method for forming a multilayer interconnect of the present invention, the second step preferably includes reducing the thickness of part of the second insulating film located under the aperture.

In the method for forming a multilayer interconnect of the present invention, it is preferably that the second and third insulating films are formed of silicon nitride and silicon oxide, respectively, in the second step, the aperture is formed by dry etching using a first etching gas containing a fluorocarbon gas and an oxygen gas, and in the third step, the interconnect groove is formed by dry etching using a second etching gas containing a fluorocarbon gas and an oxygen gas.

In this manner, the etching selectivity between silicon nitride and silicon oxide can be appropriately set by adjusting the composition of an etching gas, and thus the thickness of a second insulating film can be reduced without having the lower layer interconnect exposed.

In the method for forming a multilayer interconnect of the present invention, it is preferably that in the second step, the ratio of the fluorocarbon gas to the oxygen gas in the first etching gas and the ratio of carbon to fluoride in the fluorocarbon gas are adjusted to control the depth of part of the second insulating film located under the aperture.

In this manner, in the process step of forming an aperture, when etching time is set so that a third insulating film is overetched, the depth of part of a second insulating film which is etched can be set depending on the selectivity of silicon nitride to silicon oxide in an etching gas.

In the method for forming a multilayer interconnect of the present invention, it is preferable that in the third step, the ratio of the fluorocarbon gas to the oxygen gas in the second etching gas and the ratio of carbon to fluoride in the fluorocarbon gas are adjusted to control the depth of part of the second insulating film located under the aperture.

In this manner, in the process step of forming an interconnect groove, when etching time is set so that a third insulating film is overetched, the depth of part of a second insulating film which is etched can be set depending on the selectivity of silicon nitride to silicon oxide in an etching gas and the depth of the interconnect groove. Thus, with the third process step, the interconnect groove can be formed without having the lower layer interconnect exposed.

It is preferable that the method for forming a multilayer interconnect of the present invention further includes the step of forming a reflection-prevention film over the second insulating film, the second step includes removing part of the reflection-prevention film in which the aperture is to be formed, and the third step includes removing part of the reflection-prevention film in which the interconnect groove is to be formed.

In this manner, accuracy for patterning an aperture and an interconnect groove can be improved.

In the method for forming a multilayer interconnect of the present invention, it is preferable that the reflection-prevention film is formed of silicon oxide nitride so as to have a smaller thickness than that of the second insulating film, and in the third step, the reflection-prevention film is removed by etching under the condition where the temperature of a lower electrode of an etching apparatus is 30° C. or more.

In this manner, the etching selectivity of silicon oxide nitride to silicon nitride can be larger than 1. Therefore, when a second insulating film is formed of silicon nitride, a lower layer interconnect is not exposed.

In the method for forming a multilayer interconnect of the present invention, in the fourth step, the lower layer interconnect is preferably exposed by etching under the condition where bias power for an etching apparatus is 500 W or less.

In this manner, a second insulating film can be reliably removed. Furthermore, it is possible to reduce damages on a lower layer interconnect exposed at the bottom of an aperture.

A method for checking a multilayer interconnect according to the present invention is a method for checking a multilayer interconnect formed in a formation method including: a first step of forming a lower layer interconnect in an upper portion of a first insulating film and then forming a second insulating film and a third insulating film in this order on the first insulating film including the lower layer interconnect; a second step of forming an aperture in part of the third insulating film located above the lower layer interconnect; a third step of forming an interconnect groove in an upper portion of the third insulating film so that an upper portion of the aperture is part of the interconnect groove while reducing the thickness of part of the second insulating film located under the aperture without having the lower layer interconnect exposed; a fourth step of removing part of the second insulating film located under the aperture to expose the lower layer interconnect; and a fifth step of filling a conductive film in the aperture and the interconnect groove and thereby forming an upper layer interconnect and a connection portion for electrically connecting the upper layer interconnect and the lower layer interconnect. The method for checking a multilayer interconnect includes the steps of: forming a checking lower layer interconnect in the upper portion of the first insulating film and then forming the second insulating film and the third insulating film in this order over the first insulating film including the checking lower layer interconnect; forming a checking aperture in part of the third insulating film located above the checking lower layer interconnect in the same manner as in the second step; forming an interconnect groove in an upper portion of the third insulating film in the same manner as in the third step so that an upper portion of the aperture is part of the interconnect groove; filling a conductive film in the checking aperture and the checking interconnect groove and thereby forming a checking electrode and a checking upper layer interconnect, respectively; applying a predetermined voltage to the checking lower layer interconnect and the checking upper layer interconnect to check whether or not the checking lower layer interconnect and the checking upper layer interconnect are electrically continuous; and determining that the lower layer interconnect is not to be exposed by the third step if the checking lower layer interconnect and the checking upper layer interconnect are not electrically continuous, and that the lower layer interconnect is to be exposed by the third step if the checking lower layer interconnect and the checking upper layer interconnect are electrically continuous.

In the method for checking a multilayer interconnect, it is possible to reliably determine whether or not a lower layer interconnect is to be exposed and also to reliably form, if it has been determined that the lower layer interconnect is to be exposed, an interconnect groove without having the lower layer interconnect in the third step by resetting etching conditions. Therefore, the reliability of a multilayer interconnect can be ensured.

In the method for checking a multilayer interconnect, the checking electrode is preferably arranged in parallel to the checking lower layer interconnect and the checking upper layer interconnect.

In this manner, when one of a plurality of checking interconnects arranged in parallel is electrically connected to a lower layer interconnect, a checking lower layer interconnect and a checking upper layer interconnect are electrically continuous. Thus, an abnormal state caused in the process steps of forming a multilayer interconnect can be detected in a simple manner and with high sensitivity.

DESCRIPTION OF THE PREFERRED EMBODIMENTS

Hereinafter, a method for forming a multilayer interconnect according to an embodiment of the present invention will be described with reference to the accompanying drawings. FIGS. 1A through 1C and FIGS. 2A through 2C are cross-sectional views for illustrating respective process steps for forming a multilayer interconnect according to this embodiment.

Figure 1A:
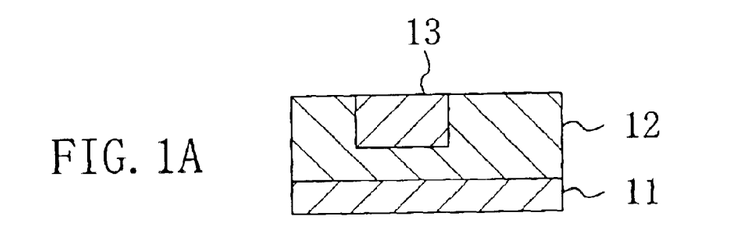
FIGS. 1A through 1C are cross-sectional views illustrating respective process steps for forming a multilayer interconnect according to an embodiment of the present invention.

First, as shown in FIG. 1, for example, a first interlevel insulating film 12 of silicon oxide is formed over a semiconductor substrate 11 in which a semiconductor integrated circuit (not shown) including an element electrode is formed. A lower layer interconnect forming region is patterned by photolithography and dry etching so that an opening is formed in an upper part of the element electrode, and then, for example, copper is deposited by sputtering or metal plating on the lower layer interconnect forming region which has been patterned. Thereafter, copper is polished by chemical mechanical polishing (CMP) until the first interlevel insulating film 12 is exposed. In this manner, a lower layer interconnect 13 of copper is formed in an upper part of the first interlevel film 12.

Figure 1B:
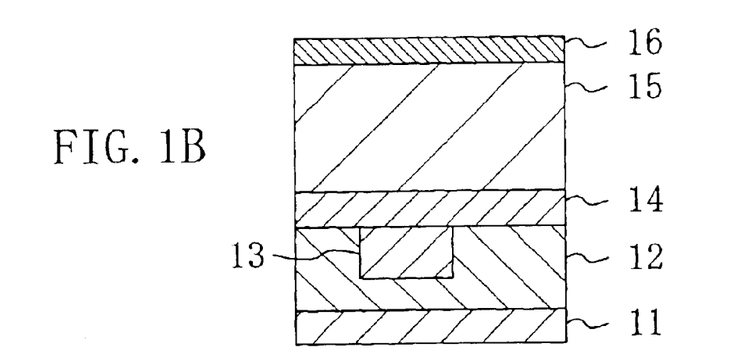

Next, as shown in FIG. 1B, an etching stopper layer 14 having a thickness of about 150 nm and formed of silicon nitride, a second interlevel insulating film 15 having a thickness of about 700 nm and formed of silicon oxide, and a reflection-prevention film 16 having a thickness of about 80 nm and formed of a silicon oxide nitride are deposited in this order by plasma chemical vapor deposition (plasma CVD).

Figure 1C:
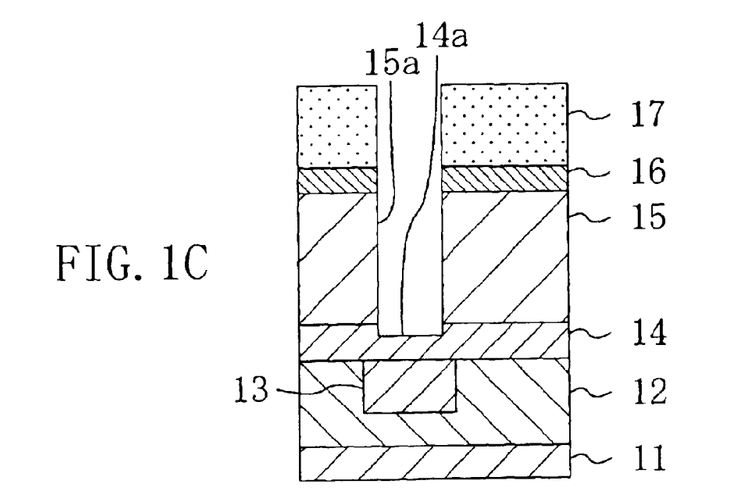

Next, as shown in FIG. 1C, a first resist pattern 17 is formed by photolithography so as to have an opening above the lower layer interconnect 13, and then the reflection-prevention film 16 and the second interlevel insulating film 15 are etched in this order by dry etching using as an etching gas a mixture of a fluorocarbon gas and an oxygen gas and the first resist pattern 17 as a mask. In this manner, an aperture 15a is formed in the second interlevel insulating film 15.

In the process step of forming the aperture 15a, the ratio of the area of the opening to the entire area of the first resist pattern when it has been formed (i.e., the mask open area ratio) is extremely small, i.e., about 1%. Therefore, it is difficult to detect an etching end point by changes in the intensity of plasma emission. In the case where etching is performed with a small open area ratio as described above, an etching depth is controlled by adjusting an etching time. In this case, an upper portion of the etching stopper layer 14 is set to be etched so that the second interlevel insulating film 15 is reliably removed. Thus, a recess portion 14a is formed in the etching stopper layer 14.

In this case, in the process step of forming an aperture 15a, etching conditions are set so that the depth of the recess portion 14a is less than 30 nm. More specifically, an etching time is set, considering variations in thickness and etching rate between the second interlevel insulating film 15 and the reflection-prevention film 16, so that the second interlevel insulating film 15 is reliably removed and then the second interlevel insulating film 15 is overetched by a depth of about 300 nm. Moreover, the composition of an etching gas is set so that the etching selectivity of silicon oxide to silicon nitride is larger than 10. Thus, the depth of part of the etching stopper layer 14 which is etched is less than 30 nm.

Figure 2A:
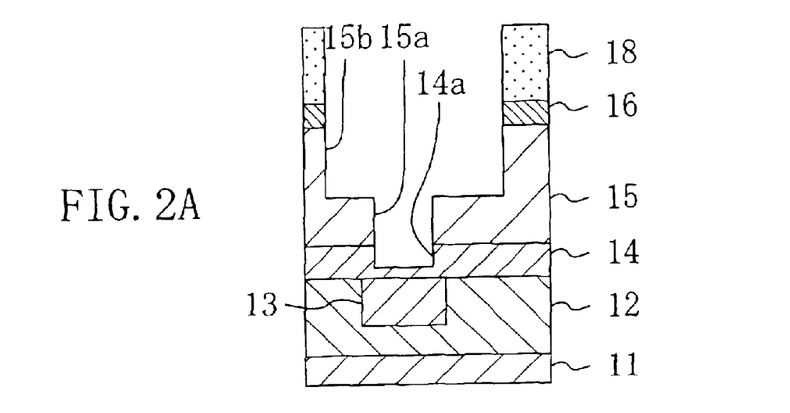
FIGS. 2A through 2C are cross-sectional views illustrating respective process steps for forming a multilayer interconnect according to the embodiment of the present invention.

Next, as shown in FIG. 2A, the first resist pattern 17 is removed by ashing, and then the surfaces of the second interlevel insulating film 15 are cleaned. Thereafter, a second resist pattern 18 is formed on the reflection-prevention film 16 by photolithography. Then, the reflection-prevention film 16 and the second interlevel insulating film 15 are patterned in this order by dry etching using as an etching gas a mixture of a fluorocarbon gas and an oxygen gas and the second resist pattern 18 as a mask, thereby forming an interconnect groove 15b having a depth of about 400 nm from the upper surface of the reflection-prevention film 16.

In this case, in the process step of forming an interconnect groove 15b, part of the etching stopper layer 14 exposed under the aperture 15a is also etched. Thus, the depth of the recess portion 14a in the etching stopper layer 14 is larger than that in the process step of FIG. 1A. Etching conditions are set so that the depth of the recess portion 14a is less than 150 nm, i.e., so that an upper portion of the lower layer interconnect 13 is not exposed.

More specifically, in etching the reflection-prevention film 16 in the process step of forming an interconnect groove 15b, a mixture of a fluorocarbon gas and an oxygen gas is used as an etching gas and the temperature of a lower electrode of an etching apparatus is set at 30° C. Thus, each of the etching selectivities of silicon oxide nitride and silicon oxide to silicon nitride is larger than 1. In this case, an etching time is set so that the second interlevel insulating film 15 is over etched by a depth of about 20 nm and thus the reflection-prevention film 16 having a thickness of about 80 nm is completely etched. Accordingly, the etching selectivity of silicon oxide nitride to silicon oxide is larger than 1, and thus the depth of the recess portion 14a which is etched in the etching stopper layer 14 is less than 100 nm.

Furthermore, in etching the second interlevel insulating film 15 in the process step of forming an interconnect groove 15b, a mixture of a fluorocarbon gas and an oxygen gas is used as an etching gas and the etching selectivity is set so as to be larger than 15. In this case, the interconnect groove forming region has been etched by a depth of about 100 nm from the upper surface of the reflection-prevention film 16 in the above-described process step of forming an reflection-prevention film 16. Thus, the second interlevel insulating film 15 is etched by a depth of about 300 nm, thereby forming an interconnect groove 15b having a depth of about 400 nm. Accordingly, the depth of the recess portion 14a which is etched in the etching stopper layer 14 is less than 20 nm.

As has been described, in the process step of forming an interconnect groove 15b, the depth of the recess portion 14a which is etched in the etching stopper layer 14 is less than 120 nm. Thus, the total of the depth of the recess portion 14a which has been etched in the process steps of forming an interconnect groove 15b and an aperture 15a is less than 150 nm. That is to say, in the process steps of forming an aperture 15a and an interconnect groove 15b, the thickness of part of the etching stopper layer 14 located under the aperture 15a is gradually reduced, but the lower layer interconnect 13 is still covered by the etching stopper layer 14 under the recess portion 14a.

Figure 2B:
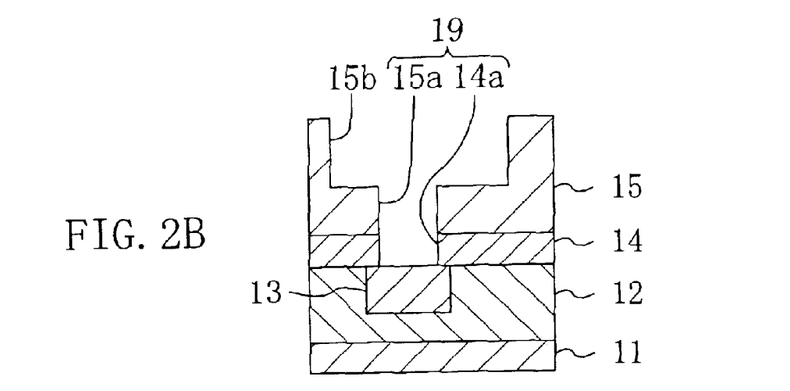

Next, as shown in FIG. 2B, the second resist pattern 18 is removed by ashing, and then the surfaces of the second interlevel insulating film 15 are cleaned. Thereafter, the part of the etching stopper layer 14 exposed at the bottom of the aperture 15a is removed by dry etching using as an etching gas a mixture of a fluorocarbon gas and an oxygen gas and the second interlevel insulating film 15 as a mask. In this manner, the recess portion 14a is made to pass through to the lower layer interconnect 13 and the recess portion 14a and the aperture 15a together form a via hole 19.

Then, in the process step of completely removing the part of the etching stopper layer 14 exposed at the bottom of the aperture 15a, the lower layer interconnect 13 is exposed to the etching gas in a plasma state. However, by setting bias power for the etching apparatus at a level of 500 W or less, damages on the lower layer interconnect 13 can be reduced. Therefore, the lower layer interconnect 13 can be prevented from being corroded.

Figure 2C:
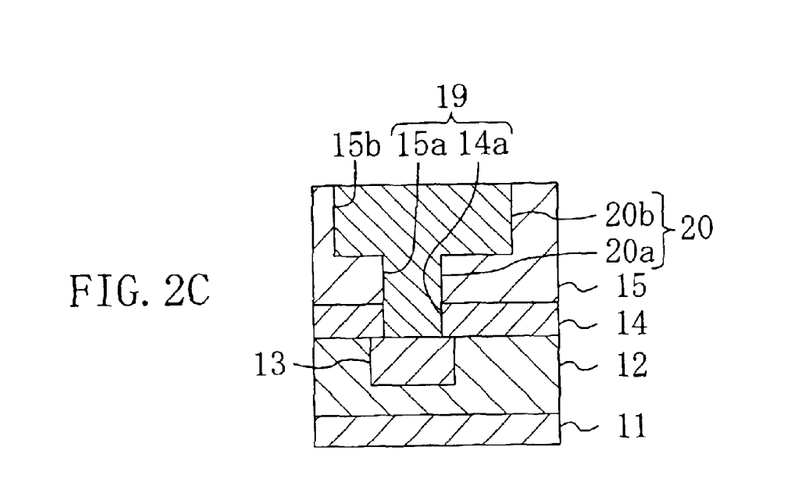

Next, as shown in FIG. 2C, a conductive film 20 of Cu is formed over the interlevel insulating film 15 as well as the inside surface of the aperture 15a and the inside surface of the interconnect groove 15b by sputtering or metal plating. Thereafter, the conductive film 20 is etched by CMP until the second interlevel insulating film 15 is exposed. Thus, part of the conductive film 20 located in the via hole 19 becomes a via contact 20a for connecting the interconnects and part of the conductive film 20 located in the interconnect groove 15b becomes an upper layer interconnect 20b.

Thereafter, although not shown in the drawings, by repeatedly performing the process steps of FIGS. 1B and 1C, and FIGS. 2A through 2C as necessary, a desired multilayer interconnect can be formed. Moreover, if a bonding pad and the like are subsequently formed, the formed interconnect can be used as a semiconductor device including a multilayer interconnect.

Hereinafter, the composition of an etching gas used to achieve predetermined etching selectivity in the above-described formation method will be described with reference to the accompanying drawings.

Figure 3:
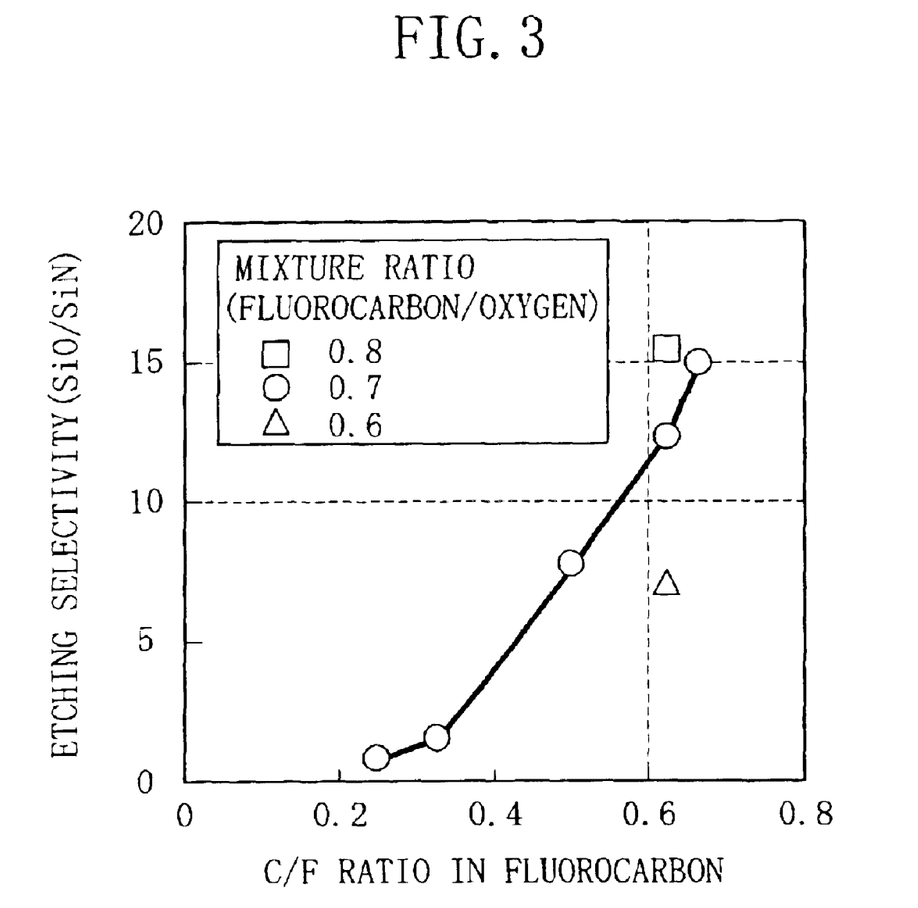
FIG. 3 is a graph showing the relation between mixture ratio and etching selectivity for an etching gas used in the process step of forming a multilayer interconnect according to the embodiment of the present invention, and the relation between the composition of a fluorocarbon gas used as an element of the etching gas and the etching selectivity.

FIG. 3 is a graph showing the relation between mixture ratio and etching selectivity for an etching gas used in the process step of forming a multilayer interconnect according to the embodiment of the present invention, and the relation between the composition of a fluorocarbon gas used as an element of the etching gas and the etching selectivity. In FIG. 3, the abscissa indicates the C/F composition ratio, i.e., the ratio of the number of the carbon atoms to the number of fluorine atoms in a fluorocarbon gas, and the ordinate indicates the etching selectivity of silicon oxide to silicon nitride. FIG. 3 also shows changes in the etching selectivity when the mixture ratio of the fluorocarbon gas to the oxygen gas in the etching gas (fluorocarbon/oxygen composition ratio) is varied.

As shown in FIG. 3, as the C/F composition ratio increases, the etching selectivity of silicon oxide to silicon nitride increases, and also as the fluorocarbon/oxygen composition ratio increases, it increases. More specifically, if the C/F composition ratio in fluorocarbon is 0.6 or more and the fluorocarbon/oxygen composition ratio in the etching gas is 0.7 or more, the etching selectivity is more than 10. If the C/F composition ratio in fluorocarbon is 0.6 or more and the fluorocarbon/oxygen composition ratio in the etching gas is 0.8 or more, the etching selectivity is more than 15.

Accordingly, in etching in the process step of forming an aperture 15a shown in FIG. 1C, the etching selectivity can be more than 10 by using an etching gas obtained by mixing a fluorocarbon gas -and an oxygen gas so that the C/F composition rate is 0.6 or more and the fluorocarbon/oxygen composition ratio is 0.7 or more.

Moreover, in etching the second interlevel insulating film 15 in the process step of forming an interconnect groove 15b shown in FIG. 2A, the etching selectivity can be more than 15 by using an etching gas obtained by mixing a fluorocarbon gas and an oxygen gas so that the C/F composition rate is 0.6 or more and the fluorocarbon/oxygen composition ratio is 0.8 or more.

As has been described, in the method for forming a multilayer interconnect of this embodiment, the depth of part of the etching stopper layer 14 which is etched is reduced without having the lower layer interconnect 13 exposed in the process steps of forming the aperture 15a and the interconnect groove 15b, which together form the via hole 19 in the second interlevel insulating film 15 formed on the etching stopper layer 14. Thus, even without filling an organic material in the aperture 15a, the lower layer interconnect 13 can be protected from damages, and thus no crown face is generated in the interconnect groove 15b. Therefore, a highly reliable multilayer interconnect can be formed.

Moreover, in the process step of removing part of the etching stopper layer 14 to expose the lower layer interconnect 13 under the aperture 15a, the level of a bias power for the etching apparatus is reduced, thereby reducing damages on the lower layer interconnect 13 caused by a plasma gas during etching.

Note that in this embodiment, the etching stopper layer 14 is formed so as to have a thickness of about 150 nm, the second interlevel insulating film 15 is formed so as to have a thickness of about 700 nm, and the reflection-prevention film 16 is formed so as to have a thickness of about 80 nm. In the process steps of forming the aperture 15a and the interconnect groove 15b, the interconnect groove 15b is formed according to the thicknesses of the layer and the films, and then etching conditions are set so that the lower layer interconnect 13 is not exposed. In this manner, the depth of the recess portion 14a which is etched in the etching stopper layer 14 is adjusted. In this case, assume that there is a difference among the thicknesses of the layer, the films and the depth of the interconnect groove. If etching conditions are set appropriately in the process steps of forming an aperture and an interconnect groove, the depth of the recess portion 14a which is etched can be adjusted so that the lower layer interconnect is not exposed.

Moreover, in this embodiment, the reflection-prevention film 16 is provided on the second interlevel insulating film 15. Thus, patterning by photolithography can be performed at high accuracy. Without the reflection-prevention film 16, however, the depth of the recess portion 14a which is etched may be adjusted by appropriately setting etching conditions according to the thickneasses of the etching stopper layer 14, the interlevel insulating film 15 and the depth of the interconnect groove 15b so that the lower layer interconnect is not exposed in the process steps of forming an aperture and an interconnect groove.

(Method for Checking a Multilayer Interconnect)

In the method for forming a multilayer interconnect according to the above-described embodiment, to prevent reduction in the reliability of a multilayer interconnect due to damages on the surface of the lower layer interconnect 13, it is important to prevent the lower layer interconnect 13 from being exposed at the bottom of the recess portion 14a in the preceding steps before the process step of FIG. 2B in which the etching stopper layer 14 is completely removed.

Hereinafter, a method for checking a multilayer interconnect formed in the formation method according to the embodiment will be described with reference to the accompanying drawings.

Figure 4:
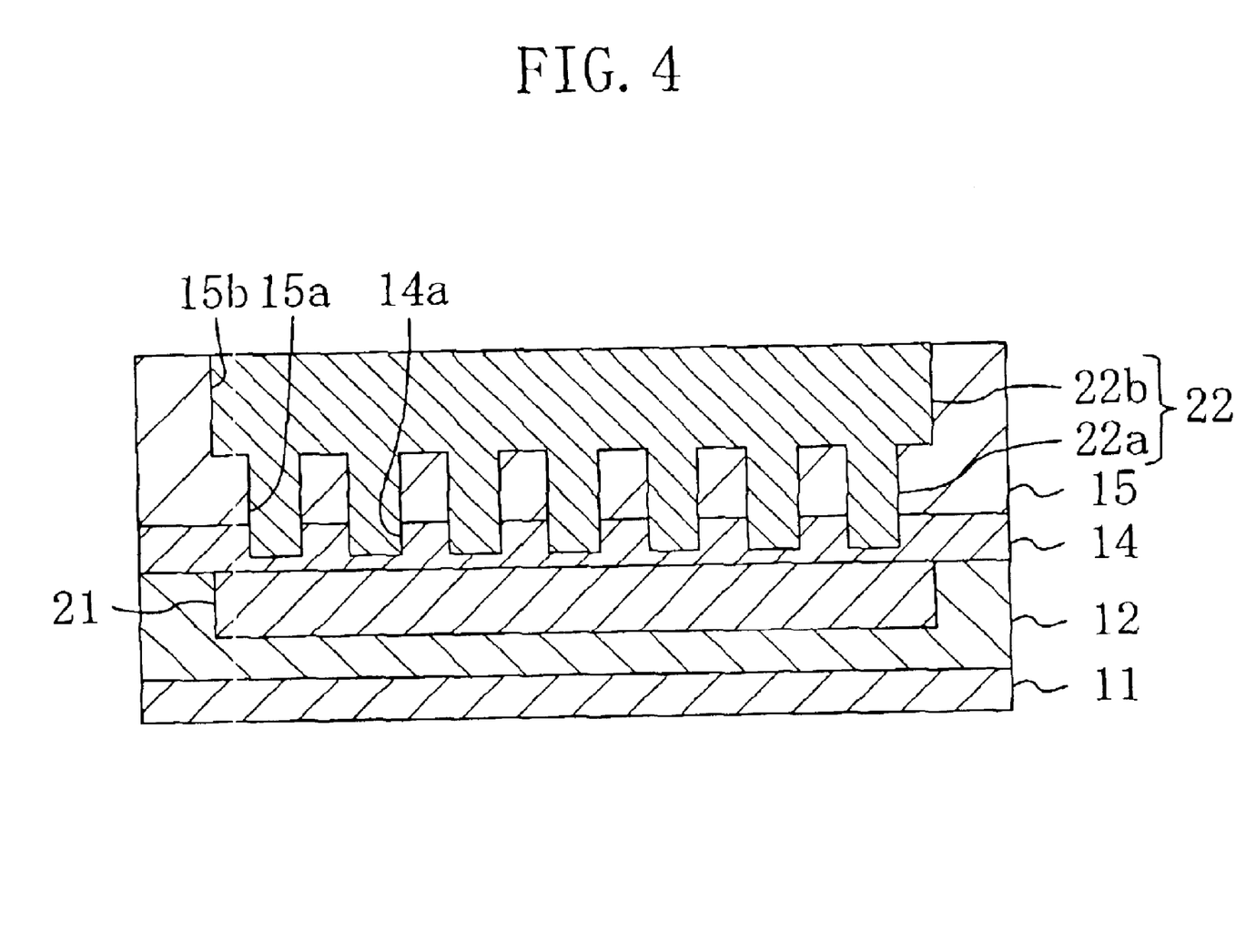
FIG. 4 is a cross-sectional view illustrating a checking interconnect for checking a multilayer interconnect formed in the method for forming a multilayer interconnect of the embodiment.

FIG. 4 illustrates a checking multilayer interconnect used in the method for checking a multilayer interconnect formed in the formation method according to the above-described embodiment. Note that in FIG. 4, each member also shown in FIGS. 1A through 1C and FIGS. 2A through 2C is identified by the same reference numeral and therefore description thereof will be omitted.

As shown in FIG. 4, as for checking interconnects used in the checking method of this embodiment, an checking lower layer interconnect 21 is formed on a semiconductor substrate 11, an checking electrode 22a is formed in each of the aperture 15a of the second interlevel insulating film 15 and the recess portion 14a in the etching stopper layer 14, and an checking upper layer interconnect 22b is formed in the interconnect groove 15b.

In this case, the checking electrode 22a is arranged in parallel to the checking lower layer interconnect 21 and the checking upper layer interconnect 22b.

In the method for forming a checking interconnects shown in FIG. 4, a checking lower layer interconnect 21 is first formed in place of the lower layer interconnect 13 in the same process step as that of FIG. 1A. An etching stopper layer 14, a second interlevel insulating film 15 and a reflection-prevention film 16 are deposited on the substrate in this order in the same process step as that of FIG. 1C. And then, the aperture 15a as a region of the second interlevel insulating film 15 in which a checking electrode 21b is to be formed is formed. In this case, the aperture 15a is etched under the same etching conditions as those in the process step shown in FIG. 1C to be patterned as a region where the checking electrode 22a is to be formed.

Next, in the same process step as that of FIG. 2A, an upper portion of the second interlevel insulating film is etched under the same etching conditions, thereby forming an interconnect groove 15b as a region in which the checking upper layer interconnect 22b is to be formed. Thereafter, in the same process step as that of FIG. 2C, a conductive film 22 of copper is formed so as to fill in the aperture 15a and the interconnect groove 15b. In this manner, the checking electrode 22a and the checking upper layer interconnect 22b are formed In the method for checking a multilayer interconnect of this embodiment, checking interconnects are first formed in the above-described manner. Next, a predetermined voltage is applied to the checking lower layer interconnect 21 and the checking upper layer interconnect 22b to check whether or not the checking lower layer interconnect 21 and the checking upper layer interconnect 22b are electrically continuous. If they are not electrically continuous, it is determined that the lower layer interconnect 13 is not to be exposed under the etching conditions in the process steps of forming the interconnect groove 15b in the above-described method for forming a multi layer interconnect. If they are electrically continuous, it is determined that the lower layer interconnect 13 is to be exposed under the etching conditions in the process steps of forming the interconnect groove 15b in the above-described method for forming a multilayer interconnect.

In this case, the checking electrode 22a is arranged in parallel to the checking lower layer interconnect 21 and the checking upper layer interconnect 22b. Thus, if the checking lower layer interconnect 21 is exposed in at least a part of the etching stopper layer 14 located under the checking electrode 22a, the checking lower interconnect 21 and the checking upper layer interconnect 22b are electrically continuous.

Accordingly, in the process step of forming a multilayer interconnect, it is possible to detect at high sensitivity and in a short time an abnormal state in which the lower layer interconnect 13 is exposed due to inappropriate etching conditions or variations in thicknesses of films.

As has been described, with the checking interconnect for checking a multilayer interconnect of this embodiment, checking interconnects are formed in the same process steps as those of the above-described method for forming a multilayer interconnect and then the conductivity of the interconnects are checked. Thus, it can be confirmed by whether or not the etching stopper layer 14 has been gradually etched to form the interconnect groove 15b and then the process steps have been normally performed so that the lower layer interconnect 13 is not exposed under the aperture 15a. If an abnormal state is detected, etching conditions are reset. Thus, the reliability of the lower layer interconnect 13 can be ensured.

Note that in this embodiment, it has been described that the lower layer interconnect 13 is connected to an element electrode of an integrated circuit element formed on the semiconductor substrate 11. However, the present invention is not limited thereto, but the lower layer interconnect 13 may be connected to some other interconnect formed on the semiconductor substrate 11.

Moreover, materials for the lower layer interconnect 13, the via contact 20a and the upper layer interconnect 20b are not limited to copper, but for example, aluminum, tungsten or other conductive materials may be used. Moreover, different conductive materials may be used for the lower layer interconnect 13, the via contact 20a and the upper layer interconnect 20b, respectively.

What is claimed is:

1. A method for forming a multilayer interconnect, comprising:
   a first step of forming a lower layer interconnect in an upper portion of a first insulating film and then forming a second insulating film and a third insulating film in this order on the first insulating film including the lower layer interconnect;
   a second step of forming an aperture in part of the third insulating film located above the lower layer interconnect;
   a third step of forming an interconnect groove in an upper portion of the third insulating film so that an upper portion of the aperture is part of the interconnect groove, while reducing the thickness of part of the second insulating film located under the aperture without having the lower layer interconnect exposed;
   a fourth step of removing part of the second insulating film located under the aperture to expose the lower layer interconnect; and
   a fifth step of filling a conductive film in the aperture and the interconnect groove and thereby forming an upper layer interconnect and a connection portion for electrically connecting the upper layer interconnect and the lower layer interconnect,
   wherein in the third step, the interconnect groove is formed in the third insulating film with the second insulating film being exposed at the bottom of the aperture.

2. The method of claim 1, wherein the second step includes reducing the thickness of part of the second insulating film located under the aperture.

3. The method of claim 2, wherein the second and third insulating films are formed of silicon nitride and silicon oxide, respectively,
   wherein in the second step the aperture is formed by dry etching using a first etching gas containing a fluorocarbon gas and oxygen gas, and
   wherein in the third step, the interconnect groove is formed by dry etching using a second etching gas containing a fluorocarbon gas and an oxygen gas.

4. The method of claim 3, wherein in the second step, the ratio of the fluorocarbon gas to the oxygen gas in the first etching gas and the ratio of carbon to fluoride in the fluorocarbon gas are adjusted to control the depth of part of the second insulating film located under the aperture.

5. The method of claim 3, wherein in the third step, the ratio of the fluorocarbon gas to the oxygen gas in the second etching gas and the ratio of carbon to fluoride in the fluorocarbon gas are adjusted to control the depth of part of the second insulating film located under the aperture.

6. The method of claim 1, further comprising the step of forming a reflection-prevention film over the second in insulating film,
- wherein the second step includes removing part of the reflection-prevention film in which the aperture is to be formed, and
- wherein the third step includes removing part of the reflection-prevention film in which the interconnect groove is to be formed.

7. The method of claim 6, wherein the reflection-prevention film is formed of silicon oxide nitride so as to have smaller thickness than that of the second insulating film, and
- wherein in the third step, the reflection-prevention film is removed by etching under the condition where the temperature of a lower electrode of an etching apparatus is 30° C. or more.

8. The method of claim 1, wherein in the fourth step, the lower layer interconnect is exposed by etching under the condition where bias power for an etching apparatus is 500 W or less.

* * * * *